United States Patent
Senda et al.

(10) Patent No.: US 7,042,012 B2
(45) Date of Patent: May 9, 2006

(54) SEMICONDUCTOR LIGHT-EMITTING DEVICE

(75) Inventors: Masanobu Senda, Aichi (JP);
Mitsuhiro Inoue, Aichi (JP); Jun Ito, Aichi (JP); Toshimasa Hayashi, Aichi (JP); Kazuki Nishijima, Aichi (JP); Naoki Shibata, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/515,655

(22) PCT Filed: Apr. 18, 2003

(86) PCT No.: PCT/JP03/05019

§ 371 (c)(1),
(2), (4) Date: Apr. 22, 2005

(87) PCT Pub. No.: WO03/100872

PCT Pub. Date: Apr. 12, 2003

(65) Prior Publication Data

US 2005/0247949 A1      Nov. 10, 2005

(30) Foreign Application Priority Data

May 27, 2002    (JP) .............................. 2002-153043

(51) Int. Cl.
*H01L 27/15* (2006.01)

(52) U.S. Cl. .............................. 257/79; 257/99; 257/98

(58) Field of Classification Search ........... 257/79–103
See application file for complete search history.

(56) References Cited

U.S. PATENT DOCUMENTS

| 5,317,587 | A | 5/1994 | Ackley et al. | |
| 6,169,294 | B1* | 1/2001 | Biing-Jye et al. | 257/99 |
| 6,333,522 | B1* | 12/2001 | Inoue et al. | 257/99 |

FOREIGN PATENT DOCUMENTS

| EP | 0 562 768 A1 | 3/1993 |
| JP | 1-226181 | 9/1989 |
| JP | 6-181364 | 6/1994 |
| JP | 6-252440 | 9/1994 |
| JP | 9-260764 | 10/1997 |
| JP | 2000-183400 | 6/2000 |

* cited by examiner

*Primary Examiner*—Cuong Nguyen
(74) *Attorney, Agent, or Firm*—McGinn IP Law Group, PLLC

(57) ABSTRACT

An insulation film 150 made of $SiO_2$ is formed on a p-type layer 106, and a multiple thick film positive electrode 120, which is a metal film formed through metal deposition, is formed on the insulation film 150 and on the p-type layer 106 at the central portion of which has a window and is exposed. The insulation film 150 has a thickness of one fourth multiple of emission wavelength. Thickness of the insulation film 150 is generally determined by multiplying one fourth of intramedium emission wavelength by an odd number. By interference effect, directivity of radiated light along the optical axis direction can be improved.

10 Claims, 2 Drawing Sheets

SEMICONDUCTOR LIGHT-EMITTING DEVICE

TECHNICAL FIELD

The present invention relates to a light-emitting semiconductor device with improved directivity. For example, a light-emitting semiconductor device of the present invention can be used as an optical transmitter in a communication system using a plastic optical fiber (POF).

BACKGROUND ART

Basically, a light-emitting diode of a surface emitting type has double-hetero structure which comprises, for example, a clad layer, an emission layer, and a clad layer deposited in sequence on a substrate. Especially, a flip-chip type light-emitting device comprises a metal electrode on the uppermost surface, and electric current is supplied to the emission layer uniformly from the electrode.

DISCLOSURE OF THE INVENTION

A conventional light-emitting diode of a surface emission type, however, has an undesirable directivity of optical axis direction, and a problem persists in that it is difficult to employ the conventional light-emitting diode to optical communications using optical fibers.

The present invention has been accomplished in order to overcome the aforementioned drawbacks. Thus, an object of the present invention is to improve directivity of a light-emitting diode of a surface emitting type. By improving directivity, a light-emitting diode of a surface emitting type can be applied to optical communications.

In order to overcome the above-described drawbacks, the followings may be useful. That is, a first aspect of the present invention provides a light-emitting semiconductor device which emits lights from a substrate side, comprising: an emission layer; a metal film which reflects lights; and a transparent insulation film which is sandwiched between a non-emission part of the emission layer and the metal film, wherein the metal film supplies electric current only to the emission part of the emission layer, and an interval of the emission layer and the metal film is determined by multiplying by an odd number one fourth of an intramedium emission wavelength in the interval.

Because the interval between the non-emission part of the emission layer and the reflective metal film is arranged to be an odd number multiple of one fourth of an intramedium emission wavelength in the interval, each phase of emitted lights heading toward the metal film becomes identical owing to multiple reflection between the metal film and the emission layer. As a result, lights converged on the direction vertical to the emission plane are emitted, which improves directivity of the device.

A second aspect of the present invention is a light-emitting semiconductor device according to the first aspect, wherein the insulation film comprises at least one selected from an oxygen compound and a nitrogen compound.

A desirable insulation film can be obtained by using at least one of a transparent oxygen compound and nitrogen compound.

A third aspect of the present invention is a light-emitting semiconductor device according to the second aspect, wherein the insulation film comprises at least one selected from $SiO_2$ and $TiO_2$ and the nitride compound comprises at least one selected from AlN and SiN.

A desirable insulation film can be obtained by using at least one of a transparent oxygen compound and nitrogen compound of the third aspect.

A fourth aspect of the present invention is a light-emitting semiconductor device according to any one of the first to third aspects, wherein the light-emitting semiconductor device is a light-emitting device of Group III nitride compound semiconductor.

By forming the light-emitting semiconductor device using Group III nitride compound semiconductor, lights having wider range of emission wavelength, or green, blue, and ultraviolet lights, can be obtained.

A fifth aspect of the present invention is a light-emitting semiconductor device according to any one of the first to fourth aspects, wherein the light-emitting semiconductor device is connected to a plastic fiber.

By using the light having high directivity which is obtained in the present invention incident on a plastic fiber, short-distance and simple communication system can be provided.

Although semiconductor materials of the above-described light-emitting semiconductor device are not limited, a light-emitting semiconductor device made of a Group III nitride compound semiconductor may comprise layers each of which is made of at least a group III nitride compound semiconductor, or a binary, ternary, or quaternary semiconductor having arbitrary compound crystal proportions and represented by $Al_xGa_yIn_{(1-x-y)}N(0 \leq x \leq 1; 0 \leq y \leq 1; 0 \leq x+y \leq 1)$. In the present specification, the "group III nitride compound semiconductor" also encompasses semiconductors in which the Group III elements are partially substituted by boron (B), thallium (Tl), etc. or in which nitrogen (N) atoms are partially substituted by phosphorus (P), arsenic (As), antimony (Sb), bismuth (Bi), etc.

When the group III nitride group compound semiconductor layer has n-type conductivity, Si, Ge, Se, Te, and C may be doped as n-type impurities. And as p-type impurities, Zn, Mg, Be, Ca, Sr, and Ba can be used.

A substrate, on which semiconductor layers are deposited, can be made of sapphire, silicon (Si), silicon carbide (SiC), spinel ($MgAl_2O_4$), ZnO, MgO, other inorganic crystal substrate, gallium nitride (GaN) and other group III nitride group compound semiconductor.

In order to form the semiconductor layers through crystal growth, molecular beam epitaxy (MBE), a metal organic vapor phase deposition (MOCVD), Halide vapor phase epitaxy (Halide VPE), and liquid phase epitaxy are useful.

In order to improve reflectivity of lights, the reflective metal film can comprise at least one selected from Al, In, Cu, Ag, Pt, Ir, Pd, Rh, W, Mo, Ti, and Ni and an alloy including at least one or more metals of these metals.

Through employment of the aforementioned aspects of the present invention, the aforementioned drawbacks can be overcome effectively and rationally.

BEST MODE FOR CARRYING OUT THE INVENTION

Embodiments of the present invention will next be described with reference to the drawings. Characteristic features of the present invention have been described above, and the present invention is not limited to the below-described specific embodiments.

FIRST EMBODIMENT

Figure 1:
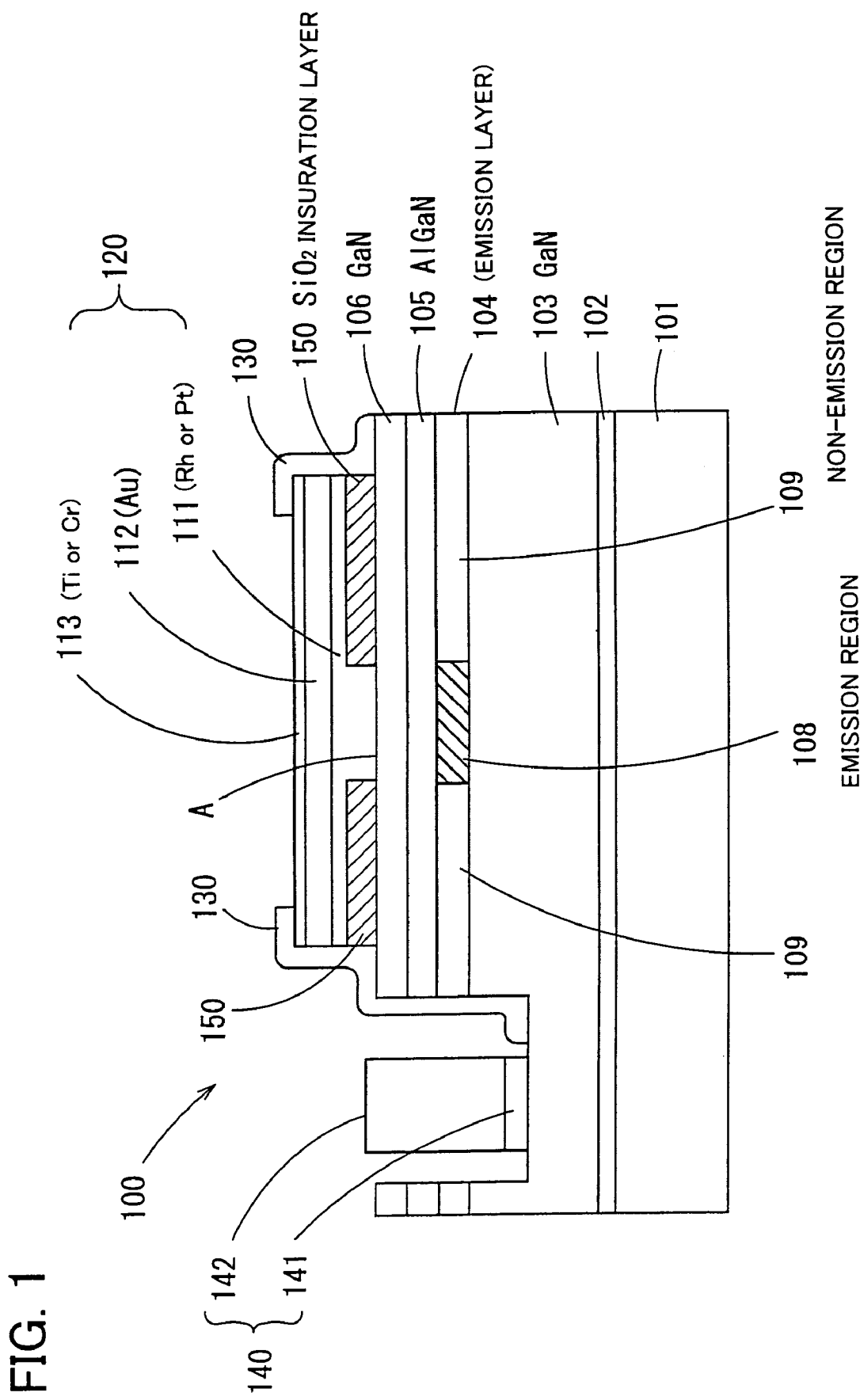
FIG. 1 is a sectional view of a light-emitting semiconductor device 100 according to a first embodiment of the present invention.

FIG. 1 is a sectional view of a flip-chip type semiconductor device 100 of the present embodiment. The semiconductor device 100 is an example of a light-emitting diode using a group III nitride compound semiconductor. About 20 nm in thickness of buffer layer 102 made of nitride aluminum (AlN) and about 4.0 μm in thickness of high carrier concentration n$^+$ layer 103 made of silicon (Si) doped GaN are formed on a sapphire substrate 101 in sequence. An emission layer 104 which has multiple quantum-well (MQW) structure comprising GaN and $Ga_{0.8}In_{0.2}N$ is formed on the layer 103. About 60 nm in thickness of p-type layer 105 made of magnesium (Mg) doped $Al_{0.15}Ga_{0.85}N$ is formed on the emission layer 104. And about 15 nm in thickness of p-type layer 106 made of magnesium (Mg) doped GaN is formed on the p-type layer 105.

On the p-type layer 106, a $SiO_2$ insulation film 150 is formed. On the insulation film 150 and a portion of the p-type layer 106 which is exposed at a window formed almost at the center of the insulation film 150, a multiple thick film positive electrode 120 is formed as a metal film by metal deposition. Thickness of the insulation film 150 is arranged to be an odd number multiple of one fourth of an intramedium emission wavelength in the insulation film 150. For example, when the emission wavelength is 430 nm, thickness of the insulation film 150 is arranged to be 107.5 nm. Accordingly thickness of the insulation film 150 may be designed in relation to the emission wavelength. Generally, it is designed to be an odd number multiple of one fourth of the intramedium emission wavelength in the insulation film 150. Interferential action at this time improves the directivity of the emitted light in the optical axis direction. On the n$^+$ layer 103, a negative electrode 140 is formed. The multiple thick film positive electrode 120 which functions as a reflective metal film comprises three layers: about 0.3 μm in thickness of first metal layer 111 which is made of at least one from rhodium (Rh) and platinum (Pt) and contacts to the p-type layer 106; about 1.2 μm in thickness of second metal layer 112 which is made of gold (Au) and is formed on the upper portion of the first metal layer 111; and about 30 Å in thickness of third metal layer 113 which is made of titanium (Ti) and is formed on the upper portion of the second metal layer. On the contrary, the negative electrode 140 comprises two layers, about 175 Å in thickness of vanadium (V) layer 141 and about 1.8 μm in thickness of aluminum (Al) layer 142, which are deposited on the exposed portion of the n$^+$ layer 103 of high carrier concentration in sequence.

A $SiO_2$ protection film 130 is formed between the multiple thick film positive electrode 120 and the negative electrode 140 formed as explained above. The protection film 130 covers the n$^+$ layer 103 which is exposed to form the negative electrode 140, the sidewall of the emission layer 104, the sidewall of the p-type layer 105, the sidewall and a portion of the upper surface of the p-type layer 106, the sidewalls of the first metal layer 111 and the second metal layer 112, and a portion of the upper surface of the third metal layer 113. The part of the protection film 130 made of $SiO_2$ film which covers the third metal layer 113 has a thickness of about 0.5 μm.

The window A of the insulation film 150 is formed according to the following processes. After the insulation film 150 is uniformly formed, a mask is formed through deposition of photoresist layer, exposure and patterning. Then the insulation film 150 is etched to expose a portion of the p-type layer 106.

The metal film 120 has a multiple layer structure. Alternatively, the metal film 120 may have a single layer structure. The metal layer also functions as an electrode which provides electric current to the emission layer 104. Alternatively, an electrode which provides electric current to the emission layer 104 may be formed separate from the metal film which functions as a reflection layer. Further the materials are arbitrary, so long as metal materials having high reflectivity are selected to form the metal film according to emission wavelength.

The multiple thick film positive electrode 120 is formed on the window A. Because the multiple thick film positive electrode 120 contacts to the p-type layer 106, electric current flows to the downward only in the window A region. As a result, in the emission layer 104, the region in which the electric current flows becomes an emission region 108 and the other area of the emission layer 104 is a non-emission region 109. And the insulation film 150 exists only on the upper portion of the non-emission region 109.

Figure 2:
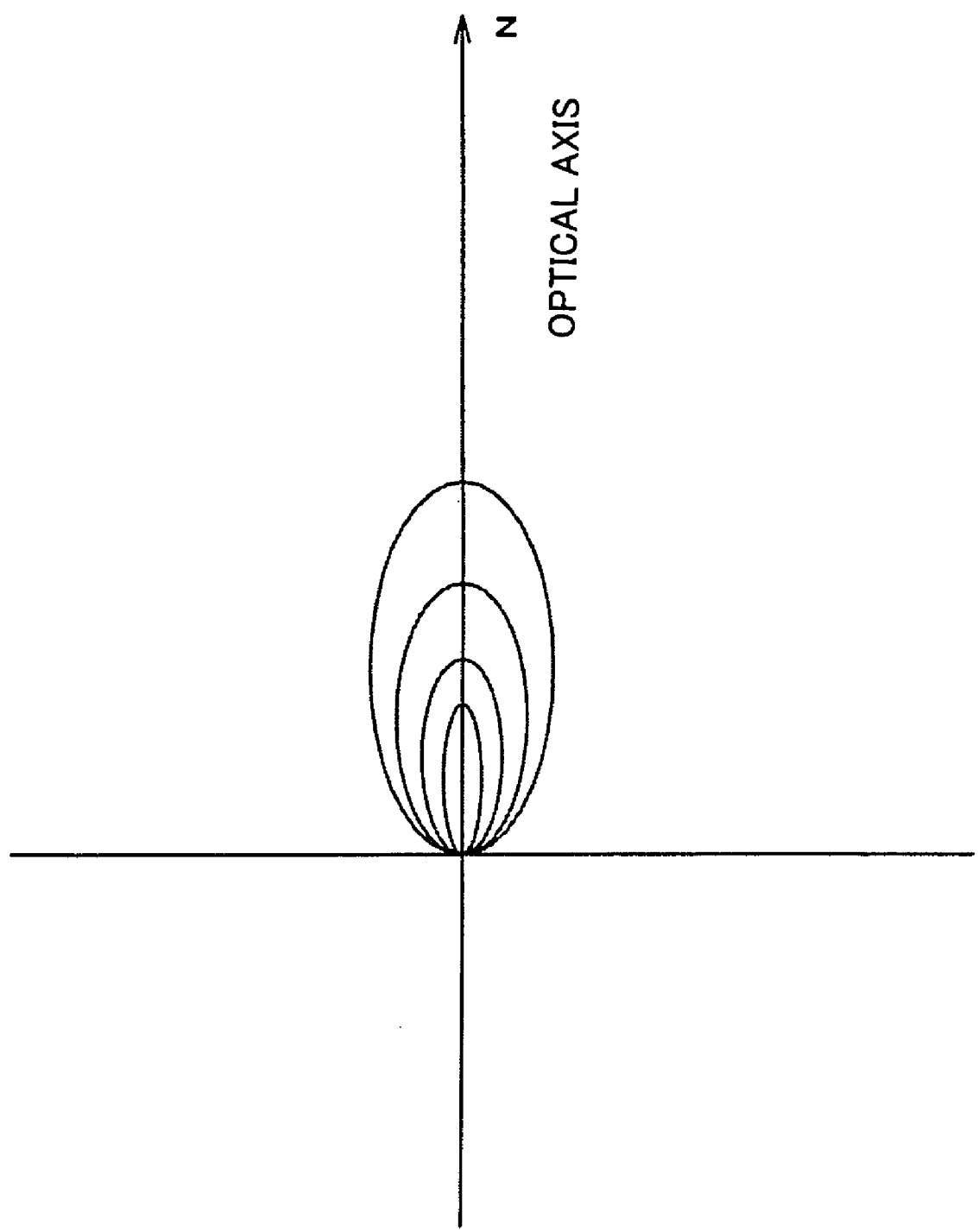
FIG. 2 is an explanation view showing directivity characteristics of the light-emitting semiconductor device according to the first embodiment of the present invention.

According to that structure, some light emitted from the emission region 108 is outputted from the sapphire substrate 101 and some light which forwards to the multiple thick film positive electrode (metal film) 120 side is reflected by the metal layer. On the contrary, light radiated from the emission region 108 in an oblique direction directs to the multiple thick film positive electrode (metal film) 120 and reflected by the metal film 120. Further, light radiated from the emission region 108 in an oblique direction is further reflected at an interface of each layer and an interface between the sapphire substrate and the outer space of it, directs to the multiple thick film positive electrode (metal film) 120, and is reflected by the metal film 120. As a result, because thickness of the insulation film 150 is arranged to be an odd number multiple of one fourth of the intramedium wavelength, directivity of the optical axis direction is improved by interference of lights as shown in FIG. 2. Accordingly, by installing a fiber cable along the optical axis direction, the device can be applied to optical communications. Especially, the light-emitting semiconductor device of the present invention is useful for a comparatively shorter range of optical communications using plastic optical fiber (POF).

MODIFIED EXAMPLE

The present invention is not restricted to the above embodiments, and many variations are possible. For example, in the first embodiment, a GaN-type semiconductor layer is used as a Group-III nitride compound semiconductor element, but a layer comprising $Ga_xIn_{1-x}N$ (such as $Ga_{0.92}In_{0.08}N$) and the like or a ternary or quaternary compound of the elements Al, Ga, In, and N having a desired mixed crystal ratio may be used. More specifically, a ternary (GaInN, AlInN, AlGaN) or quaternary (AlGaInN) Group-III nitride compound semiconductor expressed by the general formula $Al_xGa_yIn_{1-x-y}N$ ($0 \leq x \leq 1$, $0 \leq y \leq 1$, $0 \leq x+y \leq 1$) can be used. A portion of the N in these compounds can be replaced by a Group-V element such as P or As.

For example, when layers of a Group-III nitride compound semiconductor are formed on a sapphire substrate, in order to obtain a product of improved crystallinity, it is preferable to form a buffer layer so as to correct lattice misfit with the sapphire substrate. It is also preferable to provide a buffer layer when using a different type of substrate. As a buffer layer, a Group-III nitride compound semiconductor which is formed at a low temperature such as $Al_xGa_yIn_{1-x-y}N$ ($0 \leq x \leq 1$, $0 \leq y \leq 1$, $0 \leq x+y \leq 1$) and more preferably $Al_xGa_{1-x}N$ ($0 \leq x \leq 1$) is used. There may be a single such buffer layer, or multiple layers having different compositions may be used. A method of forming the buffer layer may be one which forms the buffer layer at a low temperature of 380–420° C., or the buffer layer may be formed by MOCVD at a temperature in the range of 1000–1180° C. In addition, high purity metallic aluminum and nitrogen gas can be used as source materials, and a buffer layer comprising AlN can be formed by reactive sputtering using a DC magnetron sputtering apparatus. In the same manner, a buffer layer expressed by the general formula $Al_xGa_yIn_{1-x-y}N$ ($0 \leq x \leq 1$, $0 \leq y \leq 1$, $0 \leq x+y \leq 1$, with the composition ratio being arbitrary) can be formed. Furthermore, it is possible to use the vapor deposition method, the ion plating method, the laser abrasion method, or the ECR method. Formation of the buffer layer by physical vapor deposition is preferably carried out at a temperature in the range of 200–600° C. More preferably it is carried out at a temperature in the range of 300–600° C. and still more preferably in the range of 350–450° C. When a physical vapor deposition method such as these sputtering methods is used, the thickness of the buffer layer is preferably in the range of 100–3000 Angstrom. More preferably it is in the range of 100–400 Angstrom, and most preferably it is in the range of 100–300 Angstrom. Multiple layers can be formed by a method in which a layer comprising $Al_xGa_{1-x}N$ ($0 \leq x \leq 1$), for example, and a GaN layer are alternatingly formed, a method in which layers having the same composition are alternatingly formed with a forming temperature of at most 600° C. and at least 1000° C., and the like. These methods can of course be combined with each other, and the plurality of layers may be formed by laminating three or more Group-III nitride compound semiconductors of the formula $Al_xGa_yIn_{1-x-y}N$ ($0 \leq x \leq 1$, $0 \leq y \leq 1$, $0 \leq x+y \leq 1$). In general, a buffer layer is non-crystalline, and an intermediate layer is a monocrystal. A buffer layer and an intermediate layer may be formed in a single cycle, or they may be formed in plurality of cycles, and cycles may be repeated any number of times. The more repetitions the better is the crystallinity.

A high temperature growth buffer layer may be formed on a low temperature growth buffer layer, and the Group-III nitride semiconductor which is the main body may be formed on the high temperature growth buffer layer.

In the buffer layer and the upper layers formed of a Group-III nitride compound semiconductor, a portion of the composition of the Group-III elements can be replaced by boron (B) or thallium (Tl), and a portion of the nitrogen (N) can be replaced by phosphorus (P), arsenic (As), antimony (Sb), or bismuth (Bi). It is also possible to perform doping with these elements to an extent that the elements do not appear in the chemical compositional formula. For example, to the Group-III nitride compound semiconductor $Al_xGa_{1-x}N$ ($0 \leq x \leq 1$), which does not include indium (In) or arsenic (As) in its chemical formula, by performing doping with indium (In) which has a larger atomic radius than aluminum (Al) or gallium (Ga), or with arsenic (As) which has a larger atomic radius than nitrogen (N), expansion strains of crystals due to nitrogen atoms coming out can be compensated by compressive strains, and crystallinity can be improved. In this case, acceptor impurities easily enter into the position of the Group-III element, and thus a p-type crystal is obtained as grown.

When the buffer layer and the Group-III nitride compound semiconductor layer are base layers formed by at least two cycles, each Group-III nitride compound semiconductor layer can be doped with an element having a larger atomic radius than the primary constituent element. When forming a light emitting element, it is generally preferable to use a binary or ternary Group-III nitride compound semiconductor.

When forming an n-type Group-III nitride compound semiconductor layer, a Group-IV element or a Group-VI element such as Si, Ge, Se, Te, or C can be added as an n-type impurity. In addition, a Group-II element such as Zn, Mg, Be, Ca, Sr, or Ba or a Group-IV element can be added as a p-type impurity. These can be doped in a plurality of layers, or an n-type impurity and a p-type impurity can be doped in the same layer. A Mg-doped GaN-type semiconductor implanted with Be can be changed to a hole density of $5.5 \times 10^{16}$ to $8.1 \times 10^{19}/cm^3$ by annealing at 1100° C. for 60 seconds. The activation energy of Mg is decreased to 170 mV by implanting with Be. This is thought to be because Be breaks the bonds between Mg and hydrogen and then bonds with hydrogen. Accordingly, in order to obtain a p-type layer, Be is preferably implanted in addition to acceptor impurities such as Mg.

The dislocations in the Group-III nitride compound semiconductor layer can be decreased by lateral epitaxial growth. At this time, although a mask can be used, it is also possible to use a method which does not employ a mask and in which trenches and posts are formed, and then a lateral growth layer is formed over the trench. A method using trenches and posts can form a spot-shaped or stripe-shaped trench and post on a substrate and then form a gallium nitride type compound semiconductor over the trenches, and lateral growth can be carried out over the trenches. It is also possible for there to be a gap present between the lateral growth layer and at least one of a layer beneath it and the substrate. When a gap is present, the introduction of strains due to stress is prevented, so crystallinity can be further improved. Conditions for lateral growth include a method in which the temperature is elevated, a method in which the supply of gas of a Group-III element is increased, and a method involving addition of Mg.

The p-type layers 106 to which the multiple thick film positive electrode 120 is joined preferably employs InGaN because doing so provides a high hole density. An even higher hole density can be obtained by adding Be and Mg to the p-type layers 106. Mg is preferred as an acceptor impurity. For example, the composition is preferably $In_{0.14}Ga_{0.86}N$. It is possible to use a super lattice in the p-type layers 106. For example, in order to increase the hole density of the layer forming the multiple thick film positive electrode 120 and obtain good ohmic properties, it is possible to employ a super lattice comprising p-type AlGaN/p-type GaN.

When successively forming layers of a Group-III nitride compound semiconductor on a substrate, as the substrate, it is possible to use an inorganic crystal substrate such as sapphire, silicon (Si), silicon carbide (SiC), spinel ($MgAl_2O_4$), ZnO, MgO, or the like, a Group III-V compound semiconductor such as gallium phosphide or gallium arsenide, or a Group-III nitride compound semiconductor such as gallium nitride (GaN). Organic metal vapor phase growth (MOCVD or MOVPE) is preferred as a method of forming a Group-III nitride compound semiconductor layer, but molecular beam vapor phase growth (MBE), halide vapor phase growth (halide VPE), liquid phase growth (LPE), and the like may be used, and different layers may be formed by different growth methods.

In the embodiment, a sapphire substrate 101 is used as a substrate, but the above-described materials may be used as a substrate. For example, silicon carbide (SiC) maybe used as a substrate. In the embodiment, a p-n junction GaN group light-emitting device is explained. Alternatively, AlGaAs group, GaAlInP group and other materials may be used to form the device only if it is a solid light-emitting device comprising emission region of layers.

While the present invention has been described with reference to the above embodiments as the most practical and optimum ones, the present invention is not limited thereto, but may be modified as appropriate without departing from the spirit of the invention.

The entire disclosures and contents of a Japanese Patent Application No. 2002-153043, from which the present invention claims convention priority, are incorporated herein by reference.

The invention claimed is:

1. A light-emitting semiconductor device which emits lights from a substrate side, comprising:
    an emission layer;
    a metal film which reflects lights; and
    a transparent insulation film which is sandwiched between a non-emission part of said emission layer and said metal film,
    wherein said metal film supplies electric current only to said emission part of the emission layer, and an interval of said emission layer and the metal film is determined by multiplying by an odd number one fourth of an intramedium emission wavelength in the interval.

2. A light-emitting semiconductor device according to claim 1, wherein said insulation film is made of an oxygen compound or a nitrogen compound.

3. A light-emitting semiconductor device according to claim 2, wherein said insulation film comprises at least one selected from $SiO_2$ and $TiO_2$ and said nitride compound comprises at least one selected from AlN and SiN.

4. A light-emitting semiconductor device according to claim 1, wherein said light-emitting semiconductor device comprises a light-emitting device of Group III nitride compound semiconductor.

5. A light-emitting semiconductor device according to claim 1, wherein said light-emitting semiconductor device is connected to a plastic fiber.

6. A light-emitting semiconductor device according to claim 2, wherein said light-emitting semiconductor device comprises a light-emitting device of Group III nitride compound semiconductor.

7. A light-emitting semiconductor device according to claim 3, wherein said light-emitting semiconductor device comprises a light-emitting device of Group III nitride compound semiconductor.

8. A light-emitting semiconductor device according to claim 2, wherein said light-emitting semiconductor device is connected to a plastic fiber.

9. A light-emitting semiconductor device according to claim 3, wherein said light-emitting semiconductor device is connected to a plastic fiber.

10. A light-emitting semiconductor device according to claim 4, wherein said light-emitting semiconductor device is connected to a plastic fiber.

* * * * *